US008302520B2

(12) United States Patent
Horn et al.

(10) Patent No.: US 8,302,520 B2
(45) Date of Patent: Nov. 6, 2012

(54) PUNCH DEVICE WITH INTERCHANGEABLE PUNCH AND VARIABLE PUNCH PATTERN

(75) Inventors: Kuno Horn, Nusplingen (DE); Ernst Heinemann, Renquishausen (DE)

(73) Assignee: Groz-Beckert KG, Albstadt (DE)

( * ) Notice: Subject to any disclaimer, the term of this patent is extended or adjusted under 35 U.S.C. 154(b) by 149 days.

(21) Appl. No.: 12/153,095

(22) Filed: May 14, 2008

(65) Prior Publication Data

US 2008/0282864 A1 Nov. 20, 2008

(30) Foreign Application Priority Data

May 14, 2007 (EP) .................................... 07009594

(51) Int. Cl.
*B26F 1/14* (2006.01)
*B26D 5/00* (2006.01)
(52) U.S. Cl. ............... 83/549; 83/687; 83/688; 234/106
(58) Field of Classification Search .................... 83/549, 83/687–688, 213–214, 743, 523, 613, 618, 83/684, 691, 698.71, 698.91; 234/106
See application file for complete search history.

(56) References Cited

U.S. PATENT DOCUMENTS

| 4,742,746 A * | 5/1988 | Olsson ............................ 83/387 |
| 5,303,618 A * | 4/1994 | Norell ............................ 76/107.1 |
| 6,481,323 B1 | 11/2002 | Beerhalter |
| 6,622,603 B1 | 9/2003 | DiMaria |
| 7,726,553 B2 | 6/2010 | Pohl |
| 2002/0129677 A1 * | 9/2002 | Tsuji et al. .................... 76/101.1 |
| 2004/0168560 A1 | 9/2004 | Halamoda et al. |

FOREIGN PATENT DOCUMENTS

| CN | 1526530 | 9/2004 |
| CN | 1575947 | 2/2005 |
| DE | 103 00 831 A1 | 7/2004 |
| EP | 0 781 635 A1 | 7/1997 |
| EP | 0 993 885 A1 | 4/2000 |
| JP | 3-42322 | 4/1991 |
| JP | 5319552 A | 12/1993 |
| JP | 2000-094398 A | 4/2000 |

* cited by examiner

*Primary Examiner* — Phong Nguyen
(74) *Attorney, Agent, or Firm* — Fitch, Even, Tabin & Flannery, LLP

(57) ABSTRACT

A selection plate (39) is provided on a punch device (1) for activating or deactivating individual punch holding bars (13, 14). The plate has a coupling device (40) associated with a positive-locking coupling between a punch holding bar (13, 14) and the selection plate (39). Associated with the positive-locking coupling is an edge of the selection plate (39), that is provided with a recess (42), an extension (43) of the punch holding bar (13, 14) that extends around said edge, and/or a rib (41), which is located on the underside of the selection plate (39) and is associated with the punch holding bar (13, 14). As a result, it is possible to selectively establish or eliminate a positive-locking connection between the punch holding bar (13, 14) and the selection plate (39). Via the rib (41), the punch stroke of the selection plate (39) is merely transmitted to the punch holding bar (13 or 14), which is in positive-locking engagement with the lateral edge or the projections of the selection plate (39). The elongated rib (41) covers the heads (26, 27, 28, 29) of the punches (8) and transmits the stroke in a planar manner to the punch holding bar (13 or 14).

8 Claims, 5 Drawing Sheets

PUNCH DEVICE WITH INTERCHANGEABLE PUNCH AND VARIABLE PUNCH PATTERN

CROSS-REFERENCE TO RELATED APPLICATION

This application claims the priority of European Patent Application No. 07 009 594.8, filed May 14, 2007, the subject matter of which, in its entirety, is incorporated herein by reference.

BACKGROUND OF THE INVENTION

The invention relates, in general, to a punch device and, in particular, to a punch device intended for punching holes into "green sheets" (unfired ceramic substrates).

When punching green sheets, a large number of holes are to be made in a ceramic substrate. To achieve this, an appropriate number of punches are used. The punches are aligned parallel to each other and are simultaneously pushed through the green sheet. In so doing, the green sheet is situated on a die having corresponding punch openings.

Such a punch device has been known, for example, from DE 198 55 578 A1 and U.S. Pat. No. 6,481,323 B1. The punch device comprises a lower and an upper tool part, whereby the lower tool part is a die. The upper tool part comprises a guide plate with punch guides in which the shafts of the punches can be moved back and forth in vertical direction. Each punch has a head that is connected to a drive device via a coupling. The drive device comprises one or more drives that move the coupling device linearly up and down in order to move the punches.

If such punches are to be replaced, the drive device needs to be removed. To do so, the drive unit is shifted laterally, whereby the fork-shaped coupling devices expose the heads of the punches. The punches are removed from the carrier plate in order to hold them in an upper position.

The fork-shaped couplings and the shifting mechanism for moving the drive carrier plate and the punches must be fabricated with extreme precision. The manufacture and tolerance adaptation are complex and cost-intensive. Tolerance fluctuations and an improper shifting of the coupling parts can result in damage to, or the destruction of, the stamps.

Considering this, it is the object of the invention to provide a punch device which is easier to manufacture and handle and is more robust.

SUMMARY OF THE INVENTION

The punch device in accordance with the invention comprises an upper tool part and a lower tool part. The latter contains a die with a number of punch openings. These punch openings may be arranged in so-called cutting sockets, which may be part of the die. The upper tool part or components thereof are moved toward the lower tool part and away from said lower tool part. To do so, the punches may be activated or deactivated in order to perform the punch stroke or to remain passive. For this purpose, the punches are divided into at least two groups, whereby several punches of the one group are arranged in at least one holding part, and several punches of the other group are arranged in at least another holding part. The holding parts and the punches are associated with at least one actuating element, preferably having the form of a plate, said plate being disposed to select those holding elements that are to perform the punch stroke. This selection plate is preferably supported so as to be movable in a direction transverse to the punching direction, whereby at least two, and preferably several, shifting positions can be selected in a targeted manner. To achieve this, a suitable shifting device may be used, for example, in the form of a pneumatic drive.

The holding elements are preferably punch holding bars with openings that are arranged in a row. The openings are disposed to receive the punches. Preferably, the heads of the punches are located in these openings. The various punch holding bars are preferably aligned parallel to each other and biased by suitable spring means, for example, by pressure springs, against the stops of a guide plate. The selection plate can be moved into and out of engagement with the holding bars. To do so, preferably appropriate coupling means are provided. The coupling means are preferably provided to establish or release a positive-locking connection between the holding bars and the selection plate. The positive-locking connection can be established in that the holding bars are provided with coupling recesses, whereby the projections can be moved in and out of said recesses of the selection plate. The projections of the selection plate are, e.g., represented by edge sections of said plate, which can be moved in and out of the coupling recesses in a direction transverse to the punching direction. The coupling means may also be provided the other way round, i.e., the coupling recesses may be on the selection plate and the projections on the holding bars.

By shifting the selection plate, individual punch holding bars may be activated or deactivated, i.e., they are involved or not involved in the punch stroke. In addition, the selection plate as a whole may be taken off in order to permit access to the holding bars and the punches supported therein. In this manner, the punches can be replaced or maintained in a simple manner. This requires neither special dexterity nor training. When removing or attaching the drive device to the upper tool part, the coupling connections are not established or released between the punches and the drive device, as is the case in prior art, but between the punch holding bars and the selection bar. This connection is considerably less demanding in view of the required manufacturing accuracy and manufacturing tolerances than is the case in prior art. In addition, the risk of damage to the punch is averted.

Additional details of advantageous embodiments of the invention are obvious from the drawings, description, and claims. The description is restricted to essential aspects of the invention and miscellaneous situations. The drawings disclose additional details and supplement the description.

DETAILED DESCRIPTION OF THE INVENTION

Figure 1:
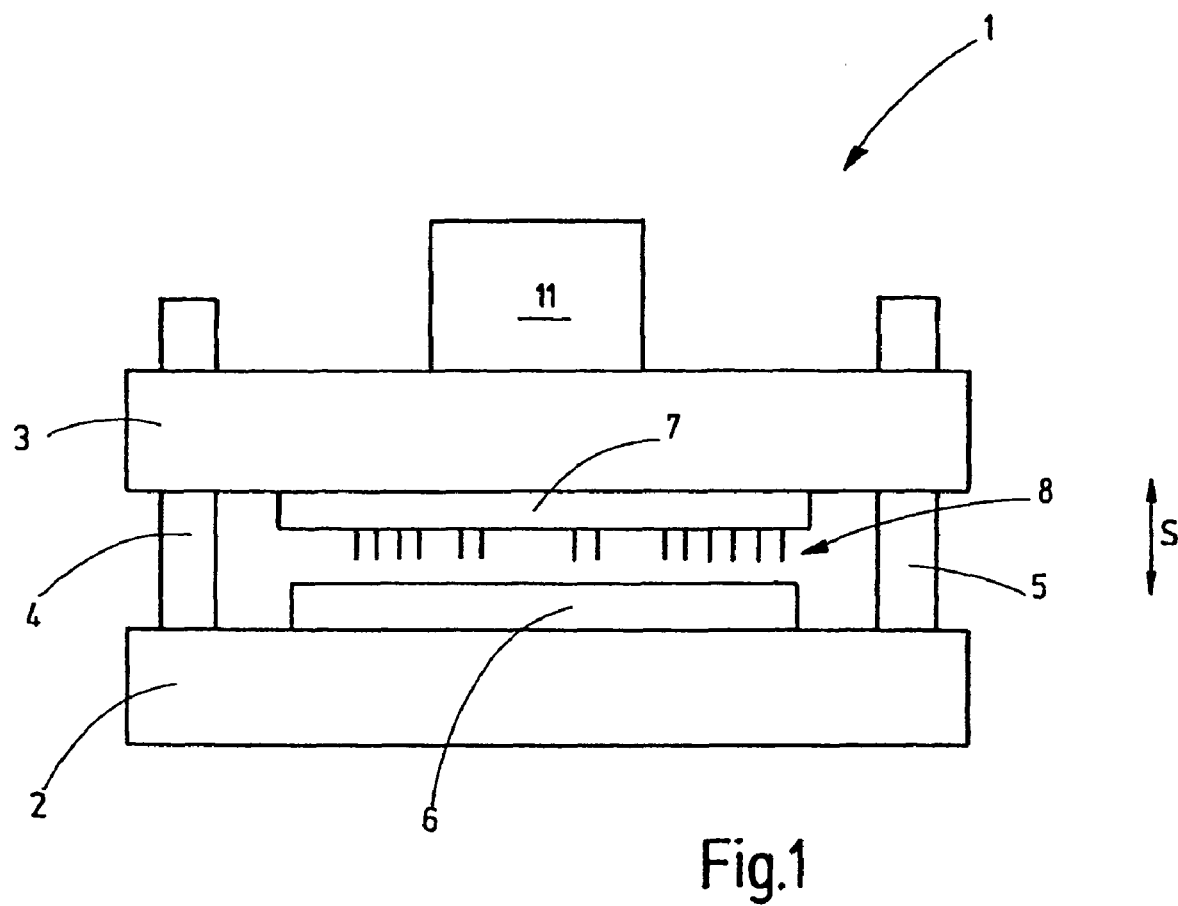
FIG. 1 is a side view of a punch device, in a schematic drawing.

FIG. 1 shows a punch device which is used to produce a pre-specified hole pattern in a planar object such as, for example, a green sheet. Green sheets are understood to mean unfired ceramic substrates, as are used, for example, in the production of ceramic supports that have electronic circuits.

Figure 2:
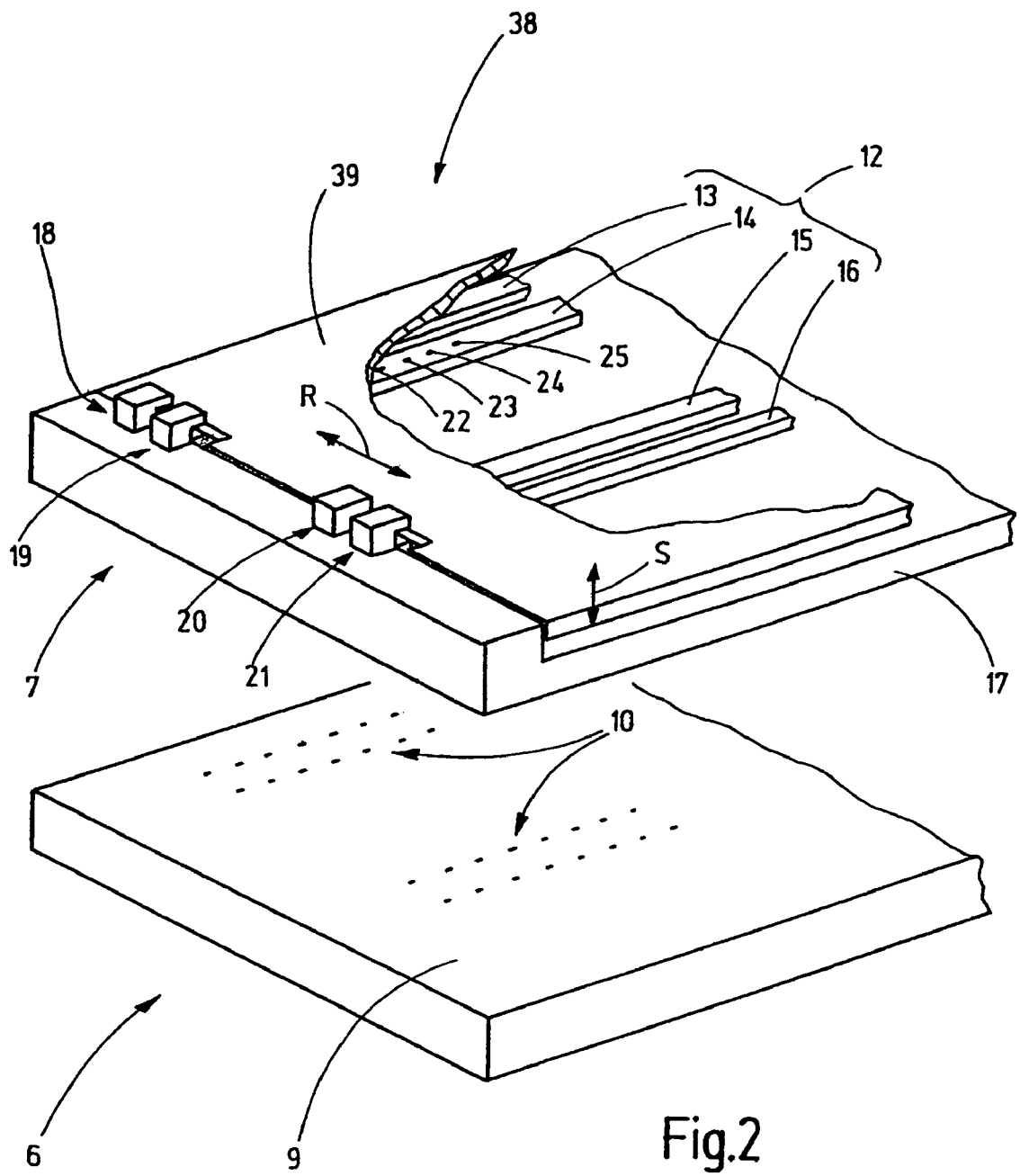
FIG. 2 is a perspective exploded view, partially in section, of the punch device in accordance with FIG. 1.

The punch device 1 has an outer frame with a lower frame part 2, an upper frame part 3 and guides 4, 5. The lower frame part 2 supports a lower tool part 6. The upper frame part 3 supports an upper tool part 7. The upper tool part 7 is provided with a number of punches 8 that are aligned parallel to each other and face in the direction of the lower tool part 6. The lower tool part 6 supports a die 9, as is shown by FIG. 2. This die is provided with a number of punch openings 10 into which the punches 8 may immerse, once they have passed through the workpiece. The punch openings may contain (not illustrated) cutting sockets.

The upper frame part 3 and/or the upper tool part 7 are connected to at least one drive device 11 which is disposed to move the punches 8 up and down. The drive device may be a mechanical, an electrical or a pneumatic or hydraulic drive device.

As is further shown by FIG. 2, the upper tool part 7 is associated with several holding elements 12 in the form of punch holding bars 13, 14, 16, in which the punches 8 are held. The punch holding bars 13 through 16 are mounted in a guide plate 17, in which they can be moved in punching direction S by at least the punch stroke. The punching direction S corresponds to the longitudinal direction of the punch 8. The elongated punch holding bars 13 through 16 are guided at their ends 18, 19, 20, 21 in corresponding recesses of the guide plate 17. Each punch holding bar 13 through 16 has a series of openings 22, 23, 24, 25 (see also FIGS. 3 through 6) that are disposed to receive the punch heads 26, 27, 28, 29.

The following description of the punch holding bar 14—in particular, with reference to FIGS. 3 through 6—is used to represent the other punch holding bars 13, 15, 16, as well as any potentially not illustrated punch holding bars, all of them being preferably configured in a uniform manner.

The punch holding bar 14 has—adjoining the openings 22 through 25—through-bores with a smaller diameter, through which extends the respective shaft 30 of each punch 8. In so doing, the straight cylindrical shaft 30 extends through the corresponding guide bores 31, 32, 33, 34 that are provided in the guide plate 17. The guide bores 31 through 34 may be provided with a guide socket that grasps and guides the shaft 30 on its exterior shell surface or on an intermediate section having a small diameter. The height of the guide socket may correspond to the length of the guide bore, however, it may also be different therefrom.

In order to precisely guide the shaft 30 of a punch 8, several guide sockets may be provided, each extending over the entire length of the punch.

Figure 3:
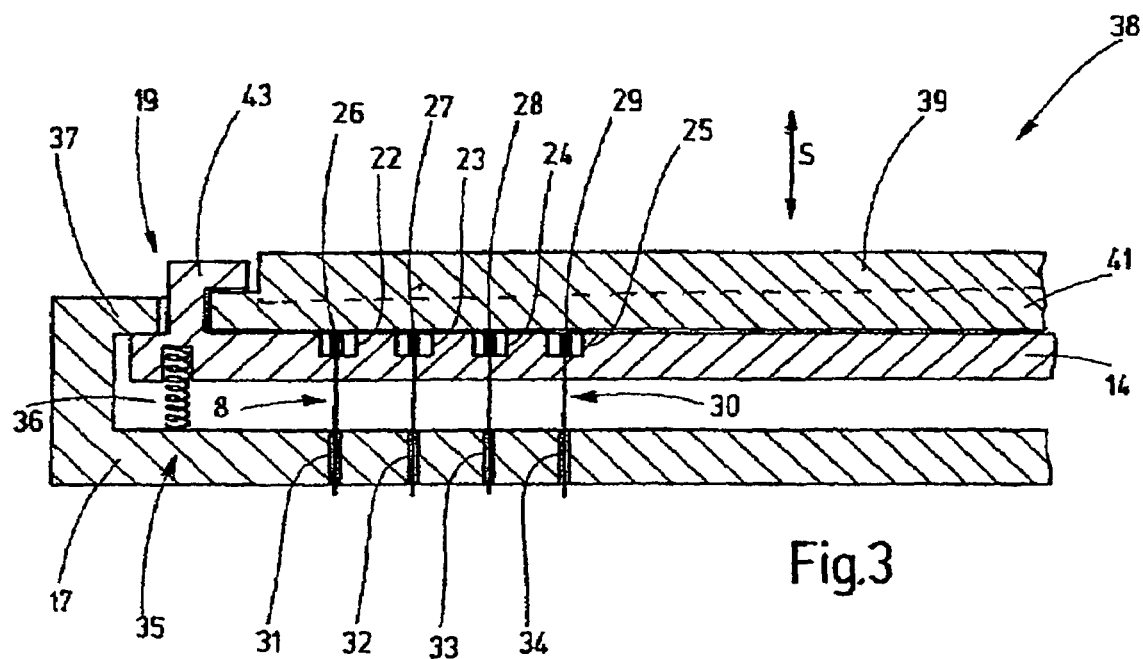
FIGS. 3 through 6 are a vertical sectional view of the punch device in accordance with FIGS. 1 and 2, in various operating and working positions.

Between the guide plate 17 and the punch holding bar 14, a spring means 35 becomes active in order to bias the punch holding bar 14 away from the guide plate 17. In the present exemplary embodiment, the spring means 35 comprises at least one, preferably two, compression springs 36 located at the ends of the punch holding bar 14. The spring means 35 biases the end 19 of the holding bar 14 against the stop 37, said stop being provided on the guide plate 17 and extending around the end 19 of the punch holding bar 14, as shown by FIG. 3. The—not illustrated—opposite end of the punch holding bar 14 is mounted and configured in an analogous manner.

Figure 4:
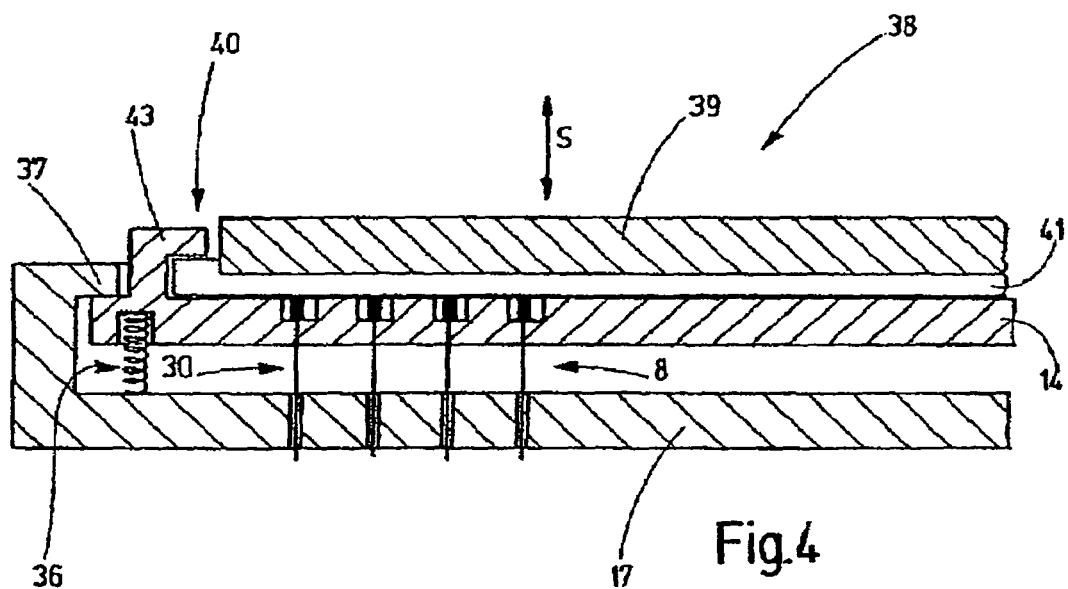

The punch holding bars 13 through 16 are associated with a selection element 38, here, configured as a selection plate 39, which covers the holding bars 13 through 16. As shown by FIG. 2, the selection plate 39 can be shifted in a selection direction R transversely to the punching direction S, i.e., horizontally in the present exemplary embodiment. In so doing, it acts together with the punch holding bar 14, as well as with the other punch holding bars 13, 15, 16, via a coupling means. As shown by FIGS. 3 and 4 with reference to the stamp holding bar 14, said coupling means comprises a pressure bar in the form of a rib 41 that is provided on the side of the selection plate 39 that is associated with the punch holding bar 14. The rib 41 and the selection plate 39 may be made in one piece of one piece, without seams. The rib 41 may also be designed as a separate bar and then be connected to the selection plate with known connecting means (screws, cement, welding, etc.). Depending on the selection position of the selection plate 39, the rib 41 is positioned exactly above one of the punch holding bars (FIG. 3) or next to the punch holding bars 13, 14 (FIG. 4). In addition, the coupling means is associated with an edge provided on the plate 39, said edge being straight and extending in the selection direction R. The edge has recesses as shown, e.g., by FIGS. 7 through 9 with reference to one recess 42, which is associated with the punch holding bars 13, 14. The recess 42 forms an edge section of the selection plate 39. The selection plate is arranged approximately centrically between, e.g., the ribs 41, as indicated in dashed lines in FIGS. 7 through 9. As shown by FIG. 8, the width of the recess 42 is dimensioned in such a manner that the two punch holding bars 13, 14 fit into it. As is shown, in particular, by FIGS. 3 through 6, each punch holding bar 13, 14 has, on its respective end 19, at least optionally an extension 43 extending around the edge of the selection plate 39, by means of which the punch holding bar 14 can be permanently coupled to the selection plate 39 in the punching direction S.

Figure 5:
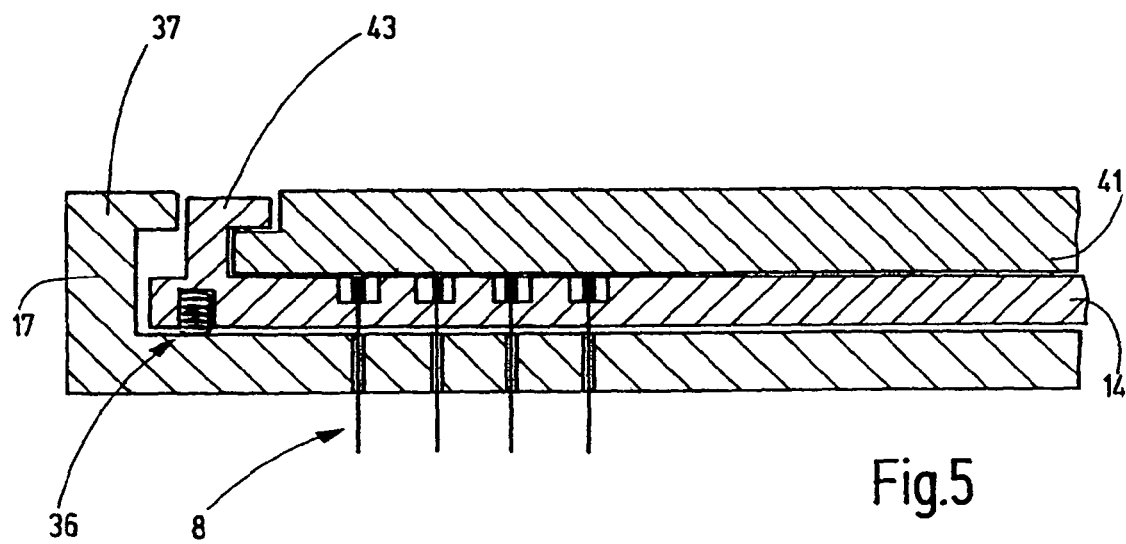

The punch device 1 described so far operates as follows:

In order to perform punching work, the punches 8 are moved in punching direction S. In order to determine which punches 8 will carry out this movement, the selection plate 39 is moved into one of the positions in accordance with FIG. 7 or 9. In so doing, either the punch holding bar 13 (FIG. 7) or the punch holding bar 14 (FIG. 9) is coupled to the selection plate 39. As is shown by FIG. 3, the rib 41, in so doing, covers the punch holding bar 14. If now—in order to carry out a punch stroke—the selection plate 39 is moved in downward direction, the rib 41, as shown by FIG. 5, pushes the punch holding bar 14 in downward direction, as a result of which the punches 8 carry out on punch stroke. This takes place against the force of the compression spring 36. In so doing, the guide plate 17 may remain inactive.

Figure 6:
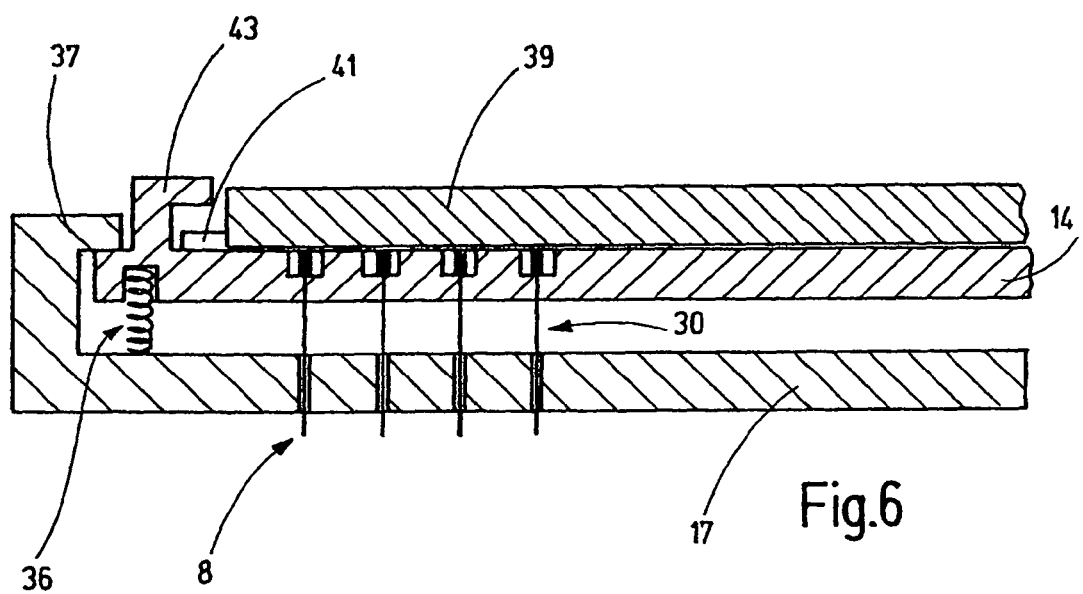
Figure 7:
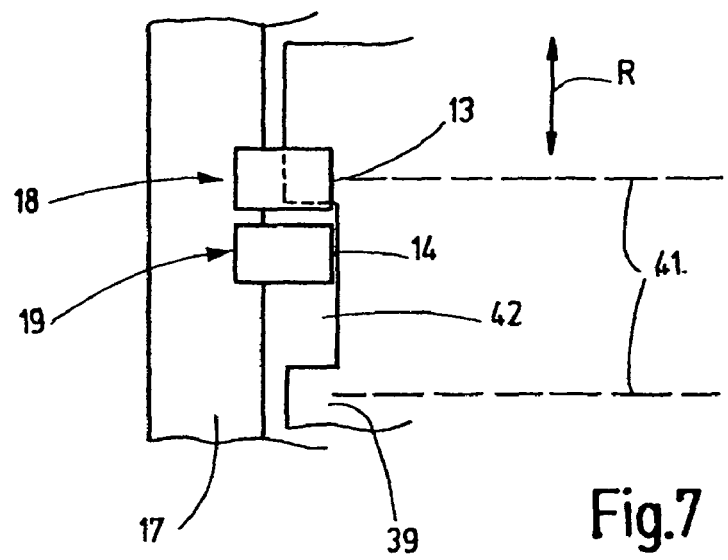
FIGS. 7 through 9 are a plan view of a detail of the punch device in accordance with FIGS. 1 and 2, in various operating positions.
Figure 8:
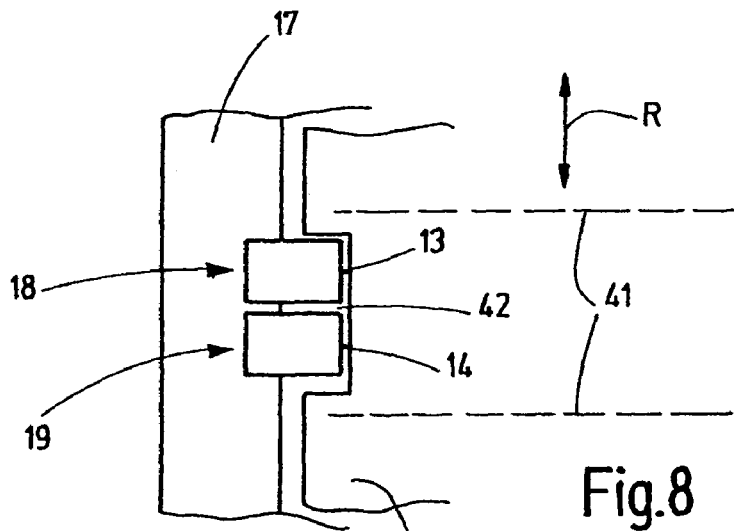

If, as opposed to this, the selection plate 39 is moved into the position in accordance with FIG. 7 (corresponding to FIG. 4), the end 19 of the punch holding bar 14 is positioned inside the recess 42. The rib 41 is positioned next to the punch holding bar 14. Consequently, viewed in punching direction S, there is no coupling between the selection plate 39 and the punch holding bar 14. If the selection plate 39 now carries out its punch stroke, the punches 8 remain in their upper position. The compression spring 36 pushes the punch holding bar 14 from the bottom against the stop 37. As is shown by FIG. 6, the rib 41 immerses in a space existing next to the punch holding bar 14 and does not actuate the punch holding bar 14.

Figure 9:
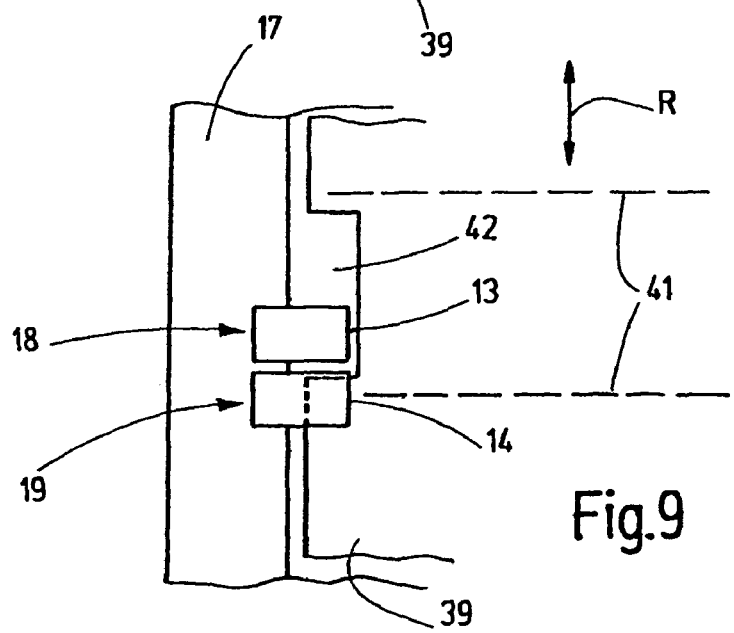

Consequently, by shifting the selection plate 39 between the positions in accordance with FIG. 7 and FIG. 9, one punch holding bar 13, 14 can be activated and the other deactivated. This applies analogously to the punch holding bars 15, 16. With this in mind, the coupling means 40 of the punch holding bars 13, 14 are activated in opposite directions, i.e., while one is coupled, the other is uncoupled.

If the selection plate 39 is moved in a center position, said plate does not activate any of the punch holding bars 13, 14, 15, 15. In this state, said plate may be taken off and removed, whereby the heads of the punches 8 are exposed. Individual punches may simply be replaced without great effort, or the punch holding bars 13, 14 with all the punches may be exchanged.

In accordance with the invention, a selection plate 39 is provided on a punch device 1, said selection plate activating or deactivating individual punch holding bars 13, 14, 15, 16. To achieve this, it has coupling means 40 that are, for example, associated with a positive-locking coupling between a punch holding bar 13, 14 and the selection plate 39. Associated with the positive-locking coupling may be an edge of the selection plate 39, said edge being provided with a recess 42, an extension 43 of the punch holding bar 13, 14, said extension extending around said edge, and/or a rib 41, which is located on the underside of the selection plate 39 and is associated with the punch holding bar 13, 14. As a result of this, it is possible to selectively establish or eliminate a positive-locking connection between the punch holding bar 13, 14 and the selection plate 39. By means of the rib 41, the punch stroke of the selection plate 39 is merely transmitted to the punch holding bar 13 or 14, which is in positive-locking engagement with the lateral edge or the projections of the selection plate 39. The elongated rib 41 covers the heads 26, 27, 28, 29 of the punches 8 and transmits the stroke in a planar manner to the punch holding bar 13 or 14.

It will be appreciated that the above description of the present invention is susceptible to various modifications, changes and modifications, and the same are intended to be comprehended within the meaning and range of equivalents of the appended claims.

| Reference Numbers: | |
|---|---|
| 1 | Punch device |
| 2 | Lower frame part |
| 3 | Upper frame part |
| 4, 5 | Guides |
| 6 | Lower tool part |
| 7 | Upper tool part |
| 8 | Punch |
| 9 | Die |
| 10 | Punch opening |
| 11 | Drive device |
| 12 | Holding elements |
| 13, 14, 15, 16 | Punch holding bars |
| 17 | Guide plate |
| S | Punching direction |
| 18, 19, 20, 21 | Ends |
| 22, 23, 24, 25 | Openings |
| 26, 27, 28, 29 | Punch heads |
| 30 | Shaft |
| 31, 32, 33, 34 | Guide bore |
| 35 | Spring means |
| 36 | Compression spring |
| 37 | Stop |
| 38 | Actuating element, selection element |
| 39 | Selection plate |
| R | Selection direction |
| 40 | Coupling means |
| 41 | Rib, pressure bar |
| 42 | Recess |
| 43 | Extension |

We claim:

1. Punch device, in particular for punching green sheets, comprising;
    a lower tool part having a die with a number of punch openings;
    an upper tool part which is supported so as to be movable relatively toward the lower tool part and away therefrom;
    a plurality of punches associated with the upper tool part;
    at least two holding bars movably arranged on the upper tool part for selective movement relative to the upper tool part in a punching direction, and wherein individual ones of the at least two holding bars are configured to receive the plurality of the punches, and,
    an actuation element supported on the upper tool part in order to selectively move the holding bars relative to the upper tool part in the punching direction during a punch stroke, the actuation element being a selection plate having a plurality of pressure bars, wherein the selection plate is additionally supported so as to be shiftable in a direction transverse to the holding bars and to the punching direction to selectively move the plurality of pressure bars of the selection plate into engagement or out of engagement with desired ones of the holding bars.

2. Punch device in accordance with claim 1, wherein the holding bars extend transversely to the parallel-held punches and have openings in which the punches are held.

3. Punch device in accordance with claim 2, wherein the openings are arranged in a row.

4. Punch device in accordance with claim 1, wherein the holding bars are biased by a spring means against at least one stop of the upper tool part.

5. Punch device in accordance with claim 1, wherein, on the holding bars and the selection plate, coupling means are provided in order to selectively couple the holding bars and the pressure bars of the selection plate with each other, or to release a coupling connection.

6. Punch device in accordance with claim 5, wherein the holding bars are divided into two groups, and the coupling means of the selection plate configured for movement in a coupling position and a release position.

7. Punch device in accordance with claim 6, wherein the selection plate has a release position in which the holding bars and the pressure bars of the selection plate are in the release position.

8. Punch device in accordance with claim 5, wherein pressure bars are associated with the coupling means, said pressure bars being arranged on a side of the selection plate facing the holding bars in order to transmit the punching movement to the holding bars when the actuation element is in a coupling position.

\* \* \* \* \*